United States Patent
Yu et al.

[11] Patent Number: 5,518,779
[45] Date of Patent: May 21, 1996

[54] FORMING COPPER CLAD LAMINATES

[75] Inventors: Tsai-An Yu; Jing-Pin Pan, both of Hsinchu, Taiwan

[73] Assignee: Industrial Technology Research Institute, Hsienchu Hsien, Taiwan

[21] Appl. No.: 302,570

[22] Filed: Sep. 8, 1994

Related U.S. Application Data

[63] Continuation-in-part of Ser. No. 991,287, Dec. 16, 1992, Pat. No. 5,372,891.
[51] Int. Cl.$^6$ .................................................. C08F 2/48
[52] U.S. Cl. ..................... 427/508; 427/171; 427/178; 427/295; 427/385.5; 427/409; 427/512; 427/517; 427/519; 427/542; 427/559
[58] Field of Search ........................... 427/508, 509, 427/512, 517, 519, 542, 559, 385.5, 409, 8, 178, 295, 171

[56] References Cited

U.S. PATENT DOCUMENTS 5,077,084 12/1991 Konotsune et al. ................. 427/96

OTHER PUBLICATIONS

J. G. Stephanie et al., "Infrared Curing of Polyimides" Antec '91, 1991, p. 1696–1699 (no month avail.).

*Primary Examiner*—Bernard Pianalto
*Attorney, Agent, or Firm*—W. Wayne Liauh

[57] ABSTRACT

An improved method for preparing copper clad laminates from a copper substrate without a conventional or infrared oven. The method contains the steps of: (a) preparing a precursory coating composition which can be subsequently cured to become polyimide; (b) coating the precursory coating composition on a copper substrate; and (c) exposing the precursory coating composition to an infrared heater provided in an infrared curing apparatus. The infrared heater is selected such that it emits infrared rays of wavelengths corresponding to the absorption spectrum of the precursory coating composition. A plurality of infrared heaters can be provided in the infrared curing apparatus, each can be designed to have a different effective heating length and/or operated at a uniquely predetermined surface temperature for optimum energy efficiency. Preferably, the precursory coating composition contains an upper layer consisting essentially of polyamic acid and a lower layer disposed between the upper layer and the copper substrate, the lower layer being a blended mixture of the polyamic acid and a modified bismaleimide.

18 Claims, 3 Drawing Sheets

FORMING COPPER CLAD LAMINATES

FIELD OF THE INVENTION

This application is a continuation-in-part of Application Ser. No. 07/991,287, filed Dec. 16, 1992, now U.S. Pat. No. 5,372,891 the content thereof is incorporated herein by reference. This invention relates to an infrared apparatus for forming copper clad laminates. More particularly, this invention relates to an infrared apparatus for curing a precursor of polyimide that has been coated on a metal substrate such as copper foil in the preparation of polyimide-coated metal clad laminates, including copper clad laminates. The copper clad laminates can be advantageously used in making flexible printed circuit (FPC), tape automatic bonding (TAB), and many other electronic applications. Preferably, the polyimide coating composition comprises a polyimide upper layer and a polyimide-bismaleimide lower layer, wherein the two layers are applied onto the copper foil using a double-layered extrusion coating process to provide enhanced adhesion characteristics, dimensional stability and surface flatness of the copper clad laminates.

BACKGROUND OF THE INVENTION

Polyimides have been widely used in the electronics industry as a film coating material on metal substrates. Polyimides are well known for their excellent heat-resisting characteristics. However, there exist several areas that need to be improved regarding the application of polyimides in the electronics industry. Typical of these problem areas include: the degree of adhesion between polyimides and the metal substrate (for example a copper foil), the dimensional stability of the electrolytic copper laminate, and the flatness of the copper laminate surface after being clad with polyimides. Surface fatness determines the closeness at which the circuit line can be packed together. A highly flat surface (i.e., a surface with large curvature radius) will be required in order to provide a fine line circuit.

A common approach to improve the degree of adhesion between polyimides and the copper foil is to use adhesives. Proper selection of adhesives can also help maintaining the flatness of the copper foil surface. However, most adhesives do not have the same extent of heat resistance as polyimides. The use of adhesives often reduces the temperature range of the final product and, therefore, limits the types of applications that polyimides may be used. The additional step of having to apply adhesives before applying the polyimide coating layer also complicates the manufacturing procedure in making copper clad laminates. Therefore, it is desirable to develop polyimide compositions that provide good adhesion characteristics between the coating layer and the copper foil without the need to use adhesives, and, at the same time, ensure that the final product has acceptable surface flatness. Furthermore, the use of an adhesive layer increases the thickness of the copper clad laminates.

As opposed to the three-layer (polyimide-adhesive-copper) copper clad laminates described above, two-layered laminates can be prepared which involves applying a polyimide precursor, typically polyamic acid, on the copper foil, then heating the coated copper foil to remove solvent and effectuate curing of the polyamic acid into polyimide. The two-layer process allows better manufacturing efficiency to be obtained. However, the curing reaction from polyamic acid into polyimide requires elevated temperature (>300° C.) to achieve complete reaction. This can cause production difficulties as well as wasting energy and requiring excessive insulation. Furthermore, at elevated temperatures, copper foil can be oxidized and darkened. These concerns discourage the curing of the polyamic acid-coated copper foil to be conducted in conventional open-air furnaces, and cause difficulties in designing a continuous process for production operations.

U.S. Pat. No. 5,077,084 discloses a process for producing a flexible printed base by directly coating a copper foil with a polyimide precursor, following by heating, drying, and curing in an inert gas furnace at temperatures of 200° and 450° C. The main disadvantage of oven-curing of polyimide, i.e., the oxidation of the copper foil, has been discussed above. In order to obtain desirable foldable of the flexible printed base, the coated copper foil must maintained at a controlled tension of between 0.02~0.2 $Kg/cm^2$, and the oxygen concentration must be maintained below 0.2%.

J. G. Stephanie and P. G. Rickerl, in an article entitled "Infrared Curing Polyimides", ANTEC pp. 1696–1699 (1991), disclosed a process of curing polyimide in an infrared oven with a 4-zone heated chamber, having 56 quartz-tungsten lamps above and below a nichrome belt. To ensure temperature uniformity inside the oven, a porous quartz muffle is provided to allow a very diffuse nitrogen gas flow. The infrared oven used in Stephanie, et al. provides essentially the same function as does the conventional oven used in the '084 patent, except that the electric heating element of the '084 patent is replaced with a filament of tungsten alloy; both of which are used as the energy source to maintain the oven at the controlled temperature.

The traditional oven-curing of polyimide, whether it be the conventional oven or the infrared oven, does not submit a very efficient use of energy. Furthermore, the heating and cooling steps involved in the oven-curing process are often time-consuming, and often impede the implementation of continuous operation. Therefore, it is desirable to develop improved techniques that can be used for curing polyimide in making copper clad laminates.

Several methods have also been disclosed in the prior art to improve physical characteristics of the two-layered polyimide-copper clad laminates. In an article entitled "New Semi-Interpenetrating Polymeric Networks from Linear Polyimides and Thermosetting Bismaleimides: 2. Mechanical and Thermal Properties of the Blends," authored by T. Pascal, et at, POLYMER, vol. 31, pp 78–83 (1990), bismaleimide was studied as an additive to be blended with polyimides to improve the mechanical properties, such as tensile strength, thereof. However, to use the polyimide-bismaleimide blend as a coating composition, other factors must also be considered, most notably the surface flatness.

In Republic of China, Utility Pat. No. 158,619 (the '619 patent), it was disclosed a bismaleimide and polyimide mixture composition for coating copper foil. The degree of adhesion, measured in terms of peel strength, was increased from 4.5 lb/in when using polyimide alone, to 8 lb/in using the mixture composition. However, the coating composition disclosed in the '619 patent does not address the issue of surface flatness. Surface curling of the copper foil, which is an indication of imperfect surface flatness, was a major problem with the mixture composition disclosed therein.

Japanese Patent App. JP 91-123,093 discloses a method for the manufacture of copper-clad laminate with multi-layer polyimide films for flexible printed circuits. An electrolytic copper foil was coated with more than two layers of polyimides having different thermal expansion coefficients. The inventors asserted that the final product showed no cuff; however, no mentioning was made regarding the degree of adhesion between the polyimide coatings and the copper foil.

SUMMARY OF THE INVENTION

The primary object of the present invention is to provide an improved technique for curing a polyimide precursor that has been coated on a copper foil in the preparation of copper clad laminates. More particularly, the primary object of the present invention is to provide an improved process for the curing of polyimide precursor, such as polyamic acid, into polyimide which does not require a conventional oven or an infrared oven. The process disclosed in the present invention utilizes an infrared heater, which, when heated, emits infrared rays in the wavelengths corresponding to the absorbing spectrum of the polyimide precursor, so as to energy-effectively cure the polyamic acid coating into polyimide coating in a continuous process. In the process disclosed in the present invention, the coating is applied such that the infrared rays can effectively penetrate a thickness of up to about 0.5 mm and be effectively absorbed by the polyimide precursory coating. For polyamic acid, it is preferred and the infrared heater emits infrared rays in the far infrared range for best energy efficiency.

In the present invention, a polyimide precursor composition, typically a polyamic acid composition is first prepared and coated onto a copper foil. The polyimide precursory composition is then dried and cured to form a polyimide coating composition. Preferably, the polyimide coating composition for use in this invention comprises a polyimide upper layer and a polyimide-bismaleimide lower layer; the two layers are applied onto the copper foil using a double-layered extrusion coating process. In this preferred embodiment, the coating composition is separated into an upper coating composition and a lower coating composition, based on their chemical compositions. However, this difference in these two "layers" mainly exists in the chemical composition thereof, and there is no sharp physical boundary as that typically exists between an adhesive layer and a coating composition. Because the lower layer and the upper layer share a common polyimide composition, this allows an effective blending between these two layers to occur at their interface, thus forming a single coating composition.

In the preferred embodiments, polyimides can be prepared from reaction between diamines and dianhydrides. Examples of diamines include p-phenylene diamine and 4-4'-diaminodiphenyl ether. Examples of dianhydrides include 3,3',4,4'-benzophenone tetracarboxylic dianhydride and biphenyl 3,3',4,4'-tetracarboxylic dianhydride In the preferred embodiments, both of the two above-mentioned diamines, i.e., p-phenylene diamine and 4-4'-diaminodiphenyl ether in a predetermined ratio, and both of the two above-mentioned dianhydrides, i.e., 3,3',4,4'-benzophenone tetracarboxylic dianhydride and biphenyl-3,3',4,4'-tetracarboxylic dianhydride in another predetermined ratio, are used as reactants to prepare the polyimides of the present invention. The reaction of diamines and dianhydrides first forms a prepolymer, poly(amid acid), which becomes polyimide after drying and curing The ratio between the diamines and the dianhydrides determines the molecular weight of the final polyimide resin. The preferred ratio between the dianhydrides and the diamines ranges from 0.96 to 0.99.

In the preferred embodiment, the bismaleimide, which is mixed with polyimide to form the lower layer coating composition, is a modified bismaleimide prepared from the reaction of the following two types of reactants:

(1) Barbituric acid or its derivative, represented by the following formula:

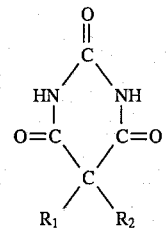

wherein $R_1$ and $R_2$ can be, independently, hydrogen, aliphatic or aromatic groups.

(2) An N,N',4,4'-diphenyl bismaleimide represented by the following formula:

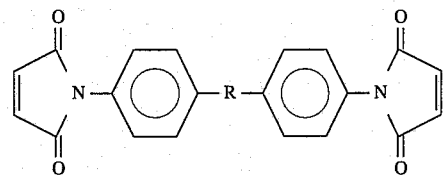

wherein R can be either a methyl group or oxygen.

Since the present invention employs direct infrared light absorption instead of the conventional oven heating (which can be either a conventional oven or an infrared oven) for curing polyimide, the curing apparatus does not have to be maintained at a constant temperature, which is required in either the '084 patent (conventional oven) or the device disclosed in Stephanie et al. (using an infrared oven). The present invention also allows simplified designs for the continuous curing of polyimide-based copper clad laminates to be made; they require reduced curing time and can be operated with greatly improved energy-efficiency. Furthermore, the cured products using the process disclosed in the present invention exhibit superior qualities.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved technique for curing a polyimide precursor that has been coated on a copper foil in the preparation of copper clad laminates using direct infrared light absorption instead of the conventional oven or an infrared oven. With the present invention, polyimide-based copper clad laminates can be prepared in a continuous and energy-efficient manner, and the cured products exhibit superior qualities than those prepared using the process disclosed in the prior art.

Figure 1:
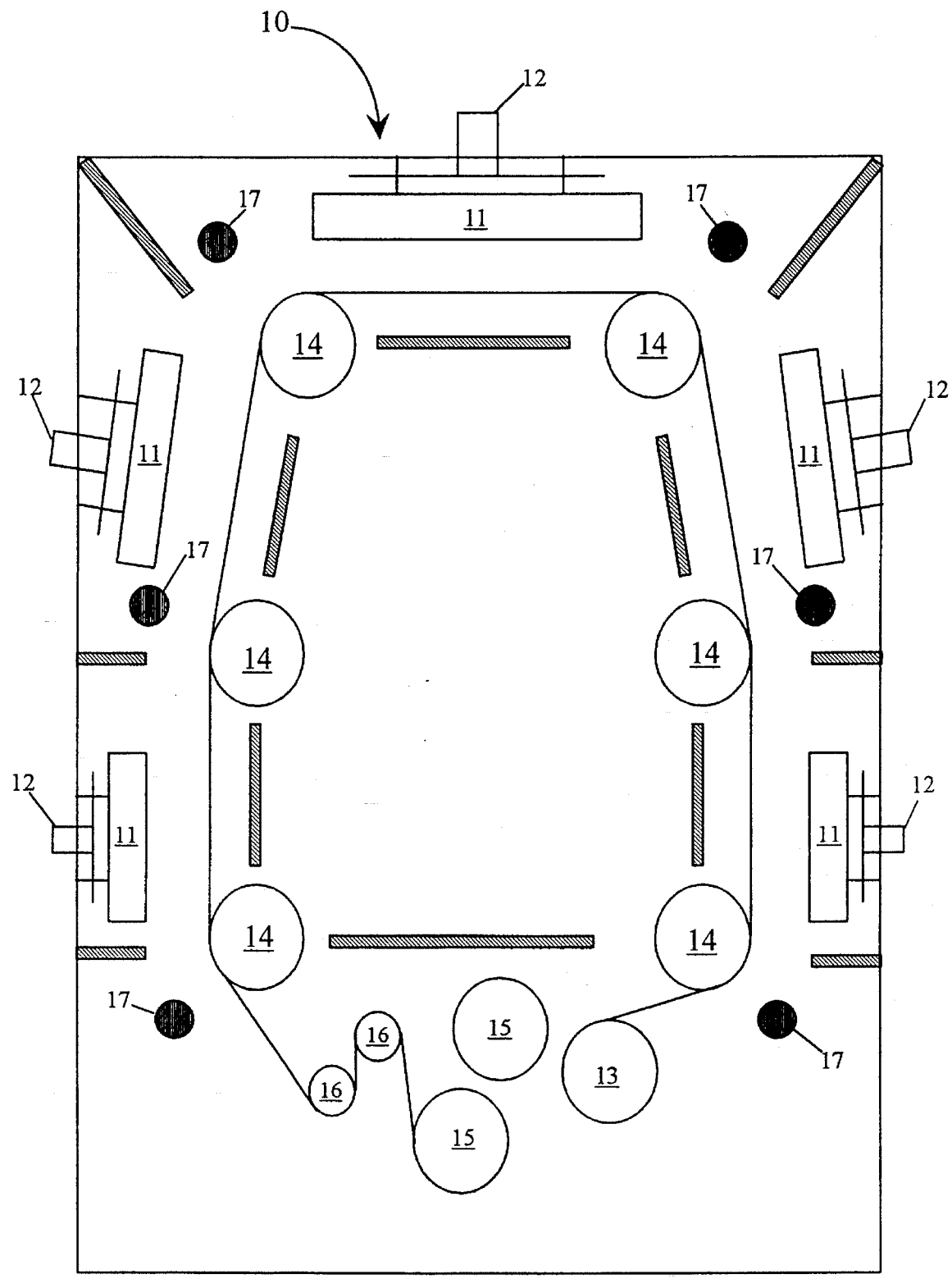
FIG. 1 is a schematic drawing showing an embodiment of the infrared curing apparatus disclosed in the present invention for cuing polyimide.

Now referring to the drawings. FIG. 1 shows a schematic illustration of an embodiment of the infrared curing apparatus disclosed in the present invention for cuing polyimide. The infrared curing apparatus 10 comprises a plurality of infrared heaters 11. The type of the infrared heater 11 should be that which emits infrared rays in the range corresponding to the absorption spectrum of the polyimide precursor. For polyamic acid based material, a ceramic infrared heater, which emits far infrared light, is preferred. Each infrared heater 11 is provided with an infrared contactless thermocouple 12. The polyimide precursor-coated copper foil is taken up by an unwind roller 13, it then passes through a plurality of support rollers 14. And the cured copper clad laminate exits the infrared curing apparatus 10 via the rewind roller 15. A pair of rubber rollers 16 provide the constant-speed motion of the coated copper foil. A certain amount of tension should be maintained on the coated copper foil during the curing operation. However, the tension should not be too high so as to damage or tear apart the copper foil. Typically, the tension exerted on the coated foil should be less than 0.1 kg/cm, or preferably less than 0.05 Kg/cm. A plurality of K-type thermocouples 17 are provided in the infrared curing apparatus 10 for measuring the temperature of the atmosphere inside the infrared curing apparatus 10.

Figure 2:
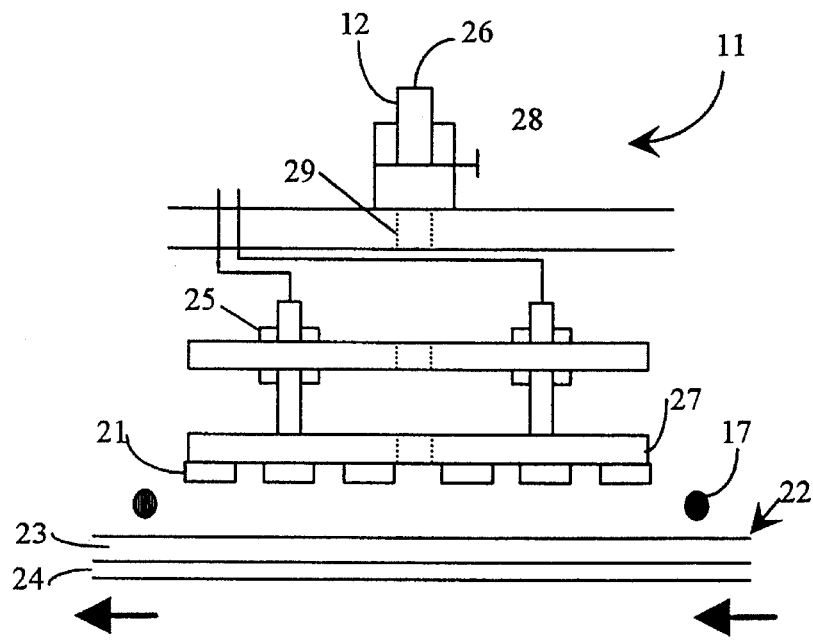
FIG. 2 is a schematic drawing illustrating the infrared heater shown in FIG. 1.

FIG. 2 is a schematic drawing of the infrared heater 11 shown in FIG. 1. The infrared heater 11 comprises a plurality of infrared heater elements 21 affixed to a support 27. An appropriate distance is maintained between the infrared heater elements 21 and the coated copper foil 22. The copper foil 22 contains a polyimide coating composition 23 coated on a substrate 24. The distance between the infrared heater elements 21 and the coated copper foil 22 is adjustable by a distance-adjusting screw 25. If the distance to too large, the temperature at the surface of the coated copper foil 22 may not be high enough to effectuate complete curing. On the other hand, if the distance is too short, non-uniform heating may be experienced. Each infrared heater 11 is provided with an infrared contactless thermocouple 12, which measures the surface temperature of the coated copper foil being cured so as to provide information for adjusting the surface temperature of the infrared heater 11. Since the heat flux in radiational heat transfer is proportional to the fourth power of the surface temperature, the present invention can more effectively and advantageously control the energy requirement during the curing operation. A close-up valve 28 is provided to close a passage 29 leading to the infrared contactless thermocouple 12 during purging operations. The infrared heater elements 21 are connected to a power source 26.

Figure 3:
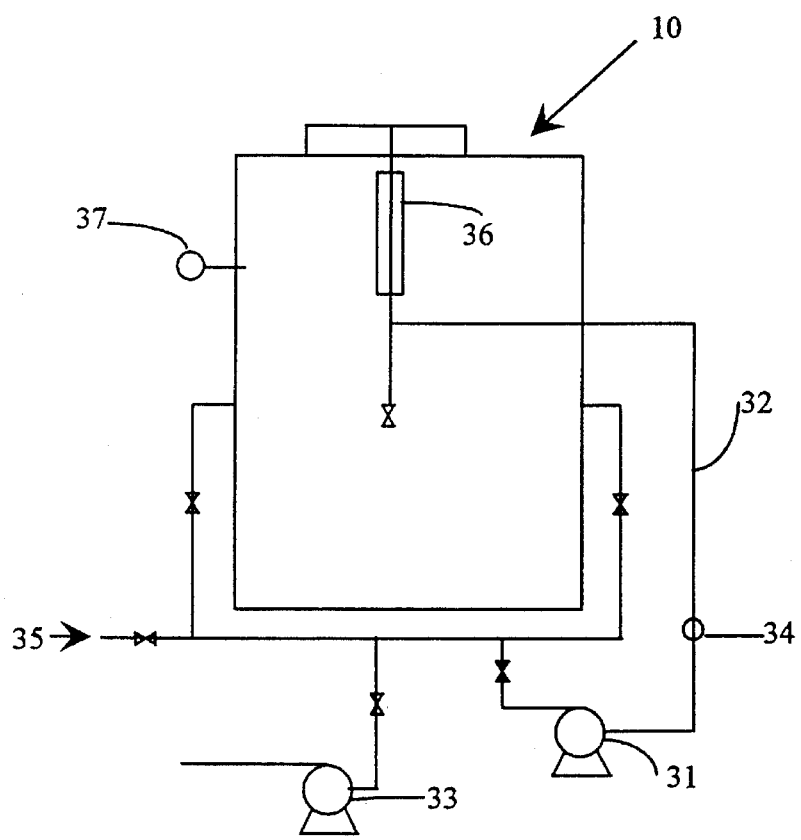
FIG. 3 is a schematic drawing showing the piping design for purging the infrared curing apparatus and maintaining the same at a positive pressure during curing operation.

FIG. 3 is a schematic drawing showing the external piping design for purging the infrared curing apparatus 10 and maintaining the curing environment at a positive pressure of inert gas during the curing operation. The piping system comprises a recycling pump 31, inert gas delivery line 32, and a vacuum pump 33. An oxygen detector 34 is provided in the inert gas delivery line 32. Before the start of a purging operation, a vacuum pump 33 is used to provide a vacuum of about 1 mm Hg inside the curing apparatus 10. Then nitrogen or other inert gas, such as carbon dioxide, etc., is introduced into the curing apparatus 10 via an inert gas supply 35. Preferably, the curing apparatus 10 should be maintained at a positive pressure of about 0.5 Kg/cm$^2$. A cooling jacket 36 is provided in the inert gas delivery line 32 which serves as a condenser to reduce the amount of solvent in the recycling operation. A pressure gauge 37 is provided to monitor the pressure inside the curing apparatus 10.

The present invention will now be described more specifically with reference to the following examples. It is to be noted that the following descriptions of example including preferred embodiment of this invention are presented herein for purpose of illustration and description; it is not intended to be exhaustive or to limit the invention to the precise form disclosed.

EXAMPLE 1

Example 1 is a detailed disclosure of how to make copper clad laminate having a two-layered coating composition, according to a preferred embodiment of the present invention. The coating composition is described as comprising an upper coating composition and a lower coating composition, based on their chemical compositions. However, it should be noted that there is no sharp physical boundary as that typically exists between an adhesive layer and a conventional coating composition.

Step 1: Preparation of Polyimide Upper Layer Composition

Reactants p-phenylene diamine (PPDA) and 4,4'-diaminodiphenyl ether (ODA), in a ratio of about 1 to 0.3, were first dissolved in a mixture solvent containing N-methyl-2-pyrrolidone (NMP) and toluene. The ratio between NMP and toluene was about 5 to 1. After complete dissolution, 3,3',4,4'-benzophenone tetracarboxylic dianhydride (BTDA) was added to the solution. About one hour thereafter, biphenyl-3,3',4,4'-tetracarboxylic dianhydride (BPDA) was added into the mixture solution in four installments, each at an interval of 25 minutes. The ratio between the dianhydrides (i.e., BTDA+BPDA) and the diamines (i.e., PPDA+ODA) was about 0.98 to 1. The entire reaction took place under a nitrogen environment at room temperature. The polyamic acid was measured to have a viscosity of 4,500 cp and a solid content of 15%.

Step 2: Preparation of modified bismaleimide

The bismaleimide (BMI) that was used to mix with polyamic acid to make up the lower layer composition was a modified bismaleimide; it was prepared from the reaction between a mixture of barbituric acid and its derivatives, and N,N'-4,4'-diphenyl methane-bismaleimide in a molar ratio between about 1/10 and 1/3. The reaction took place at temperatures between 100° to 130° C., in the presence of an appropriate solvent, for example, NMP, for 0.5 to 6 hours.

Step 3: Preparation of the Polyamic acid-BMI Lower Layer Composition

The lower layer composition was prepared by mixing polyamic acid from Step 1 with the modified BMI from Step 2. The amount of BMI used in making the lower layer composition was 10% of the polyamic acid. The polyamic acid-BMI was measured to have a viscosity of 4,500 cp.

Step 4: Double-layered Extrusion Coating

Figure 4:
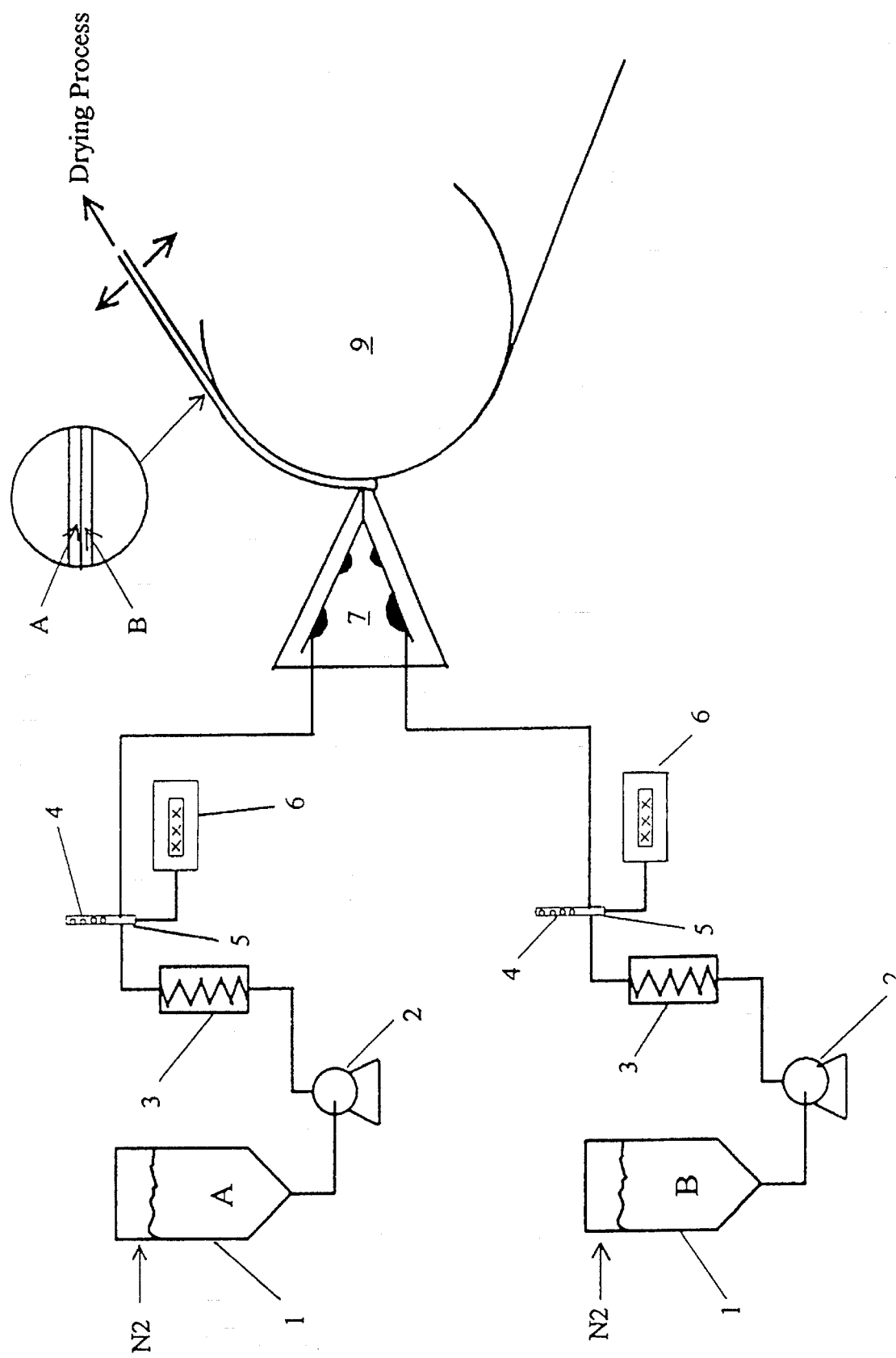
FIG. 4 shows a schematic drawing of the double-layered extrusion coating process that was utilized in this invention in making copper laminates.

FIG. 4 shows a schematic of the double-layered extrusion coating process that utilized in this invention in making the copper laminate. The copper foil was an one ounce rolled anneal copper foil, having a thickness of 35 µm. Polyimide from Step 1 and the polyimide-BMI from Step 3 described above were stored in storage tanks A and B, respectively. A nitrogen blank was applied in both storage tanks A and B. A gear pump 2 was used to deliver the coating composition from each storage tank. Each of the two coating compositions first passed through a filter 3, then a debubbler 4. A pressure sensor 5 was attached to each of the debubblers 4 to detect any pressure anomaly. The pressure readings were displayed in pressure displays 6. The two coating compositions converged at the double-layered extrusion die 7 before they were applied onto a moving copper foil 8, which was rolled pass the extrusion die 7 by the pulling of a chill roller 9. The upper layer had a thickness of 250 µm. The lower layer had a thickness of 250 µm. After drying, the upper layer and the lower layer had thicknesses of 25 µm and 25 µm, respectively, thus providing a final total thickness of 50 µm.

Step 5: Curing the Coated Copper in An Infrared Curing Apparatus

The coated copper foil prepared above was pre-heated at 150° C. for 20 minutes. Prior to the start of the curing operation, the close-up valve 28 was closed and the vacuum pump was turned on, until the infrared curing apparatus reached a vacuum below 1 mm Hg. Then nitrogen gas was allowed into the apparatus until the inner pressure reached 0.1 Kg/cm$^2$ psig. If the oxygen content measured by the oxygen sensor was greater than 1%, then the above steps were repeated. After a nitrogen flow rate of at least 5 ml/min was maintained, the close-up valve was opened and the recycling pump was turned on. The ceramic infrared heaters provided in the curing apparatus were ceramic infrared heaters, which emit far infrared light corresponding to the absorption spectrum of polyamic acid to be cured.

During the curing operation, the distance between the coated copper foil and the infrared heater was maintained at 5 cm, to provide uniform and optimum heating via radiation. A tension of 0.05 Kg/cm was maintained on the coated copper foil. The infrared curing apparatus 10 as shown in FIG. 1 contains five infrared heaters, each was designed to operate essentially independently to provide a separate heating zone, and was controlled at a respectively pre-determined temperature. The infrared heaters were designed to have varying lengths, so as to provide different curing time in each separate heating zone, and provide an optimum curing condition in accordance with the material being cured. The temperature and the heating time of each infrared heater, counting from the one nearest the unwind roll to the one nearest the rewind roll, are summarized in Table 1 below:

TABLE 1

| Heat Zone | Heater Temperature | Surface Temperature of Polyimide Layer | Heat Time |
|---|---|---|---|
| 1 | 200° C. | 105° C. | 10 min |
| 2 | 350° C. | 258° C. | 10 min |
| 3 | 555° C. | 355° C. | 20 min |
| 4 | 350° C. | 252° C. | 10 min |
| 5 | 200° C. | 103° C. | 10 min |

Curing length, which is defined as the product of heating time and the moving speed of the coated copper foil, is an important parameter determine the completeness of polyimide curing. With the present invention, the heating time can be adjusted by properly selecting infrared heaters of appropriate dimension.

After the coated copper foil was cured, the final product was tested for the following physical properties: 90° peel strength (in lb/in), tensile strength (in Kg/cm$^2$), elongation (%), and curvature radius (cm). Curvature radius is an indication of the surface flatness, a larger curvature radius indicates better surface flatness. The test results are summarized in Table 2.

EXAMPLE 2

The coating composition and curing conditions in Example 2 were identical to those described in Example 1, except that an electrolytic copper foil was used, instead of the rolled anneal copper foil. The electrolytic copper foil had the same thickness of 35 µm. After the coated copper foil was cured, the final product, a copper clad laminate, was tested for their peel strength, tensile strength, elongation, and curvature radius. The test results are also summarized in Table 2.

EXAMPLE 3

The coating composition and curing conditions in Example 3 were identical to those described in Example 1, except that the upper layer and the lower layer had thicknesses of 12.5 µm and 12.5 µm, respectively, thus providing a final total thickness of 25 µm after drying. After the coated copper foil was cured, the copper clad laminate was tested for their peel strength, tensile strength, elongation, and curvature radius. The test results are also summarized in Table 2.

COMPARATIVE EXAMPLE 1

The coating composition in Comparative Example 1 was identical to that described in Example 1; however, the coated copper foil was cured using a conventional oven under a nitrogen environment. After the coated copper foil was pre-heated, a specimen having a dimension of 30 cm× 30 cm was cut and placed inside a nitrogen oven for curing. The curing condition in the nitrogen oven was maintained as follows:

Room Temperature to 150° C.: 30 min (vacuum)
150° C. isothermal: 30 min (vacuum)
150° C. to 250° C.: 30 min (vacuum)
250° C. isothermal: 30 min (vacuum)
150° C. isothermal: 30 min (vacuum)

250° C. to 350° C.: 30 min (N$_2$)
350° C. isothermal: 120 min (N$_2$)
350° C. to Room Temperature: 3.5 Hours (N$_2$)

After the coated copper foil was cured, the copper clad laminate was tested for their peel strength, tensile strength, elongation, and curvature radius. The test results are also summarized in Table 2.

TABLE 2

|  | Example 1 | Example 2 | Example 3 | Comp. Ex. 1 |
|---|---|---|---|---|
| Copper Foil Type | rolled anneal | electrolytic | rolled anneal | rolled anneal |
| Thickness of Copper Foil | 35 μm | 35 μm | 35 μm | 35 μm |
| Thickness of Polyimide Layer | 50 μm | 50 μm | 25 μm | 50 μm |
| Curing Method | IR | IR | IR | N$_2$ oven |
| 90° Peel Strength (lb/in) | 8.2 | 8.1 | 8.0 | 8.1 |
| Tensile Strength (Kg/cm$^2$) | 25.0 | 25.2 | 25.0 | 25.1 |
| Elongation (%) | 31% | 29% | 28% | 30% |
| Curvature (cm) | ∞ | ∞ | ∞ | 5 |

From Table 2, it is shown that the peel strength, tensile strength, and elongation are about the same regardless of the curing method used, while the copper clad laminates cured by infrared curing of the present invention exhibited better surface flatness than that cured by conventional oven. However, the main advantage of the present invention is that the curing time can be substantially reduced: about 20 minutes in the present invention vs about 120 minutes in conventional oven curing. If the time required for reaching and cooling from the target curing temperature is taken into account, the advantage of using the present invention can be a ten-fold saving in curing time. Furthermore, the curing time using a conventional oven or an infrared oven will be proportional to the thickness of the polyimide layer. On contrast, the curing time is largely independent of the polyimide thick when the total thickness is less than 0.5 mm.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for preparing copper clad laminates from a copper substrate comprising the steps of:
   (a) preparing a precursory coating composition which can be subsequently cured to become polyimide;
   (b) coating said precursory coating composition on a copper substrate; and
   (c) exposing said precursory coating composition to an infrared heater provided in an infrared curing apparatus;
   (d) wherein said infrared heater being adapted to emit infrared rays of wavelengths correponding to an absorption spectrum of said precursory coating composition.

2. The method for preparing copper clad laminates according to claim 1 wherein said precursory coating composition comprising polyamic acid.

3. The method for preparing copper clad laminates according to claim 2 wherein said infrared heater is a ceramic infrared heater capable of emitting far-infrared rays.

4. The method for preparing copper clad laminates according to claim 1 wherein said infrared curing apparatus comprising a plurality of infrared heaters, each being adapted to operate at a separate temperature.

5. The method for preparing copper clad laminates according to claim 4 wherein said at least two of said infrared heaters have different effective heating lengths.

6. The method for preparing copper clad laminates according to claim 1 wherein said infrared curing apparatus containing at least one infrared contactless thermocouple, which is adapted to measure a surface temperature of said precursory coating composition being cured and controlling emitting temperature of said infrared heater.

7. The method for preparing copper clad laminates according to claim 1 wherein said infrared curing apparatus containing an rewind roller, at least one support roller, at least a pair of rubber rollers, and an unwind roller for receiving, guiding, pulling, and exiting said copper copper substrate, respectively.

8. The method for preparing copper clad laminates according to claim 7 wherein said combination of rollers being adapted to provide a tension on said coated copper substrate.

9. The method for preparing copper clad laminates according to claim 7 wherein said combination of rollers being adapted to provide a tension of less than 0.1 Kg/cm on said coated copper substrate.

10. The method for preparing copper clad laminates according to claim 1 wherein said infrared curing apparatus being connected to an inert gas supply and a vacuum pump.

11. The method for preparing copper clad laminates according to claim 10 wherein said infrared curing apparatus being connected to a recycling pump via an inert gas delivery line for circulating said inert gas inside said infrared curing apparatus.

12. The method for preparing copper clad laminates according to claim 11 wherein said inert gas delivery line being connected to an oxygen sensor for measuring oxygen content.

13. The method for preparing copper clad laminates according to claim 1 wherein said precursory coating composition is formed into a composite layer which comprises:
   (a) an upper layer consisting essentially of polyamic acid; and
   (b) a lower layer disposed between said upper layer and said copper substrate, said lower layer consisting essentially of a blended mixture of said polyamic acid and a modified bismaleimide.

14. The method for preparing copper clad laminates according to claim 13 wherein said polyamic acid is prepared by following process:

(a) adding p-phenylene diamine and 4,4'-diaminodiphenyl ether at a pre-determined ratio into a mixture solvent consisting essentially of N-methyl-2-pyrrolidone and toluene;

(b) adding 3,3',4,4'-benzophenonetetracarboxylic dianhydride into the mixture solution prepared from step (a); and (c) gradually adding biphenyl-3,3',4,4'-tetracarboxylic dianhydride into the solution prepared from step (b).

15. The method for preparing copper clad laminates according to claim 13 wherein said bismaleimide is a modified bismaleimide prepared from the reaction between the following two groups of compounds:

(a) barbituric acid or its derivative, represented by the following formula:

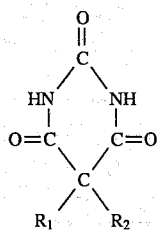

wherein $R_1$ and $R_2$ can be, independently, hydrogen, aliphatic or aromatic groups.

(2) an N,N',4,4'-diphenyl bismaleimide represented by the following formula:

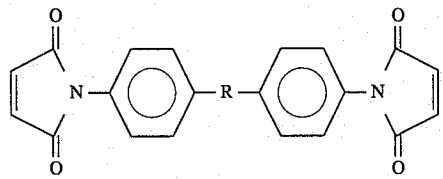

wherein R can be either a methyl group or oxygen.

16. The method for preparing copper clad laminates according to claim 13 which comprises the step of simultaneously applying said upper layer and said lower layer coating compositions onto said copper substrate in a double-layered coating process.

17. The method for preparing copper clad laminates according to claim 13 wherein infrared curing apparatus containing five infrared heaters arranged in ascending then decending surface temperatures from 200° to 550° C. then from 550° to 200° C.

18. The method for preparing copper clad laminates according to claim 1 wherein said copper substrate comprises either a rolled anneal copper foil or an electrolytic copper foil.

* * * * *